United States Patent
Yanagisawa et al.

(10) Patent No.: US 6,426,591 B1
(45) Date of Patent: Jul. 30, 2002

(54) PACKAGE FOR HOUSING PHOTOSEMICONDUCTOR ELEMENT

(75) Inventors: Mitsuo Yanagisawa; Hisaki Masuda, both of Shiga (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/405,961

(22) Filed: Sep. 27, 1999

(30) Foreign Application Priority Data

Sep. 28, 1998 (JP) .......... 10-274040
Sep. 28, 1998 (JP) .......... 10-274046

(51) Int. Cl.$^7$ ............... H01J 63/04
(52) U.S. Cl. ............... 313/512; 385/92
(58) Field of Search ............... 313/512, 495, 313/511, 498; 385/92, 93, 94

(56) References Cited

U.S. PATENT DOCUMENTS

| | | | | |
|---|---|---|---|---|
| 4,135,038 A | * | 1/1979 | Takami et al. | 428/427 |
| 4,383,164 A | * | 5/1983 | Eto | 219/121 |
| 5,111,522 A | | 5/1992 | Chaoui et al. | |
| 6,036,375 A | * | 3/2000 | Yanagisawa et al. | 385/94 |

FOREIGN PATENT DOCUMENTS

| JP | 63220593 A | 9/1988 |
|---|---|---|
| JP | 5-72445 | 3/1993 |

* cited by examiner

Primary Examiner—Michael H. Day
Assistant Examiner—Joseph Williams
(74) Attorney, Agent, or Firm—Hogan & Hartson, L.L.P.

(57) ABSTRACT

A package for housing a photosemiconductor element comprises a substrate having a mounting portion on a top surface of which a photosemiconductor element is mounted, a frame attached onto the substrate to surround the mounting portion and having a through hole on a side thereof, a cylindrical fixing member attached around the through hole of the frame and having a space therein for transmitting an optical signal, a light transmitting member attached to the cylindrical fixing member, for clogging the inside of the fixing member and a lid attached onto a top surface of the frame, hermetically sealing the photosemiconductor element. The fixing member is made of an alloy of from 40 to 60 wt % iron and from 40 to 60 wt % nickel. The coefficient of thermal expansion of the fixing member is about $9.5 \times 10^{-6}/°$ C. (room temperature to 400° C.), which is close to that of the light transmitting member of amorphous glass, so that no thermal stress caused by the difference in coefficient of thermal expansion occurs in attaching the two. Because there is no thermal stress, which causes the double-refraction of the light excited by the photosemiconductor element, the excited light is received by the optical fiber member without being double-refracted in the light transmitting member, and the transmission efficiency of optical signal is enhanced.

8 Claims, 1 Drawing Sheet

PACKAGE FOR HOUSING PHOTOSEMICONDUCTOR ELEMENT

BACKGROUND OF THE INVENTION

1. Field of the Invention

The present invention relates to a package for housing a photosemiconductor element.

2. Description of the Related Art

Hitherto, a package for housing a photosemiconductor element comprises a metallic substrate generally made of metal such as an iron-nickel-cobalt alloy and a copper-tungsten alloy, having a mounting portion for mounting the photosemiconductor element at the center of the top surface thereof, around the mounting portion a plurality of external lead terminals being fixed so as to penetrate through an insulating member from the top surface to the bottom surface of the substrate; a frame made of an iron-nickel-cobalt alloy and the like, the frame being bonded on the metallic substrate via a brazing material such as silver brazing material so as to surround the mounting portion for mounting the photosemiconductor element, the frame having a through hole on a side thereof; a cylindrical fixing member made of metal such as an iron-nickel-cobalt alloy, the cylindrical fixing member being attached around the through hole of the frame via a brazing material such as a gold-tin alloy and having a space therein in which an optical signal is transmitted; a light transmitting member made of amorphous glass and the like, the light transmitting member being attached to the cylindrical fixing member via a low melting point brazing material such as a gold-tin alloy having a melting point of 300 to 400° C. to clog the inside of the fixing member; and a lid attached onto the top surface of the frame to hermetically seal the photosemiconductor element. The package for housing a photosemiconductor element is made into a photosemiconductor device as a product in the steps of bonding and fixing the photosemiconductor element to the mounting portion of the metal substrate, electrically connecting respective electrodes of the photosemiconductor element with external lead terminals via bonding wires, bonding the lid on the top surface of the frame, housing the photosemiconductor element hermetically within the housing composed of the metal substrate, the frame and the lid, and connecting an optical fiber to the cylindrical fixing member.

Such a photosemiconductor device functions as a photosemiconductor device for use in high speed optical communications and others in such a manner that the photosemiconductor element is optically excited by a driving signal supplied from an external electrical circuit, and the excited light is received by the optical fiber through the light transmitting member to be transmitted within the optical fiber.

However, the prior art package for housing a photosemiconductor element, which comprises a light transmitting member made of amorphous glass having a coefficient of thermal expansion of $8.5 \times 10^{-6}/°C$. (30 to 400° C.) and a cylindrical fixing member made of an iron-nickel-cobalt alloy having a coefficient of thermal expansion of about $4.5 \times 10^{-6}/°C$. (room temperature to 400° C.) has a drawback that when the light transmitting member is attached to the cylindrical fixing member via a low melting point brazing material, thermal stress is caused between the light transmitting member and the cylindrical fixing member due to the difference in coefficient of thermal expansion between the two, and which thermal stress remains in the light transmitting member. Accordingly, when the light exited by the photosemiconductor element is passed through the light transmitting member to be received by the optical fiber, double-refraction of the excited light is caused due to the thermal stress existing in the light transmitting member, and consequently the optical fiber receives only part of the excited light, with the result that the light receiving efficiency of the optical fiber as well as the transmission efficiency of optical signal decreases.

Hence, in order to eliminate the drawback, it is conceivable to form a fixing member to which the light transmitting member made of the amorphous glass is attached, out of an alloy of from 40 to 60 wt % iron and from 40 to 60 wt % nickel, having a coefficient of thermal expansion close to that of the light transmitting member.

In the case where such a fixing member is formed out of the alloy of from 40 to 60 wt % iron and from 40 to 60 wt % nickel, since the coefficient of thermal expansion of the fixing member is about $9.5 \times 10^{-6}/°C$. (room temperature to 400° C.), close to the coefficient of thermal expansion of the light transmitting member made of the amorphous glass (about $8.5 \times 10^{-6}/°C$.:30 to 400° C.), in attaching the light transmitting member to the fixing member almost no thermal stress due to a difference in coefficient of thermal expansion occurs and accordingly there exists almost no thermal stress in the light transmitting member.

However, although no thermal stress is caused between the fixing member and the light transmitting member in attaching the light transmitting member to the fixing member, the frame is made of a metallic material such as an iron-nickel-cobalt alloy, having a thermal expansion of $4.5 \times 10^{-6}/°C$. (room temperature to 400° C.), which is different from the coefficient of thermal expansion of the fixing member (about $9.5 \times 10^{-6}/°C$.: room temperature to 400° C.) made of the alloy of from 40 to 60 wt % iron and from 40 to 60 wt % nickel, thermal stress due to the difference in coefficient of thermal expansion between the two occurs in attaching the fixing member on the outer surface around the through hole of the frame via a brazing material of a gold-tin alloy or the like. The thermal stress adversely affects the light transmitting member attached to the fixing member, namely causes double-refraction of the light excited by the photosemiconductor element in passing through the light transmitting member, which results in a drawback that the light receiving efficiency of optical fiber and the transmission efficiency of optical signal decrease.

SUMMARY OF THE INVENTION

The present invention has been devised in view of the drawbacks mentioned above and the object of the invention is to provide a package for housing a photosemiconductor element capable of causing excited light to be efficiently received by an optical fiber and achieving an enhanced transmission efficiency of optical signal.

The invention provides a package for housing a photosemiconductor element comprising:

a substrate having a mounting portion on a top surface of which a photosemiconductor element is mounted;

a frame attached onto the substrate so as to surround the mounting portion, having a through hole on a side thereof;

a cylindrical fixing member attached around the through hole of the frame, having a space therein in which an optical signal is transmitted;

a light transmitting member attached to the cylindrical fixing member, for clogging an inside of the fixing member; and a lid attached to a top surface of the frame, for hermetically sealing the photosemiconductor element, wherein the fixing member is made of an alloy of from 40 to 60 wt % iron and from 40 to 60 wt % nickel.

According to the package for housing a photosemiconductor element of the invention, because the fixing member is made of the alloy of from 40 to 60 wt % iron and from 40 to 60 wt % nickel, the coefficient of thermal expansion of the fixing member is about $9.5 \times 10^{-6}/°C$. (room temperature to 400° C.). Thereby, the coefficient of thermal expansion of the fixing member becomes close to $8.6 \times 10^{-6}/°C$. (30 to 400° C.), which is the coefficient of thermal expansion of the light transmitting member. As a result, in attaching the light transmitting member to the fixing member almost no thermal stress due to a difference in coefficient of thermal expansion occurs between the two and almost no thermal stress exists in the light transmitting member. Accordingly, in transmitting excited light of the photosemiconductor element to the optical fiber member via the light transmitting member, the excited light is efficiently received by the optical fiber member as it is without being double-refracted in the light transmitting member and the transmission efficiency of optical signal is highly enhanced.

In the invention it is preferable that the light transmitting member is made of amorphous glass.

The light transmitting member of the invention is made of lead amorphous glass mainly containing a silicon oxide and a lead oxide or boro-silicate amorphous glass whose main components are boric acid and siliceous sand. In transmitting the light excited by the photosemiconductor element through the light transmitting member to the optical fiber member, the excited light is received by the optical fiber member as it is without being double-refracted in the light transmitting member. Accordingly the light can be efficiently received by the optical fiber member with the result that the transmission efficiency of optical signal is enhanced.

In the invention it is preferable that the light transmitting member is brazed to the fixing member via a metalized layer comprising a first layer made of at least one of titanium, titanium-tungsten and tantalum nitride, a second layer made of at least one of platinum, nickel and nickel-chrome and a third layer made of at least one of gold, platinum and copper.

According to the invention, the light transmitting member is fixed to the fixing member, for example, by coating the outer periphery of the light transmitting member with the metalized layer in advance and by brazing the metalized layer to the fixing member via a brazing material such as a gold-tin alloy. Thereby, the reliability of the attachment of the fixing member with the light transmitting member is enhanced, and perfect hermetic sealing of the attachment part of the housing for housing the photosemiconductor element is achieved and the photosemiconductor element housed within the housing may be operated normally and stably for a long period of time.

It is noted that the metalized layer is formed into a three-layer structure by laminating the first layer made of at least one of titanium, titanium-tungsten and tantalum nitride which are active to the amorphous glass and which bond strongly therewith, the third layer made of at least one of gold, platinum and copper which enhance the wettability of the brazing material in brazing the metalized layer to the fixing member and strongly attach the metalized layer to the fixing member, and the second layer made of at least one of platinum, nickel and nickel-chrome which prevents the bonding strength of the metalized layer to the transmitting member from decreasing due to diffusion of the first layer into the third layer by the heat of brazing. The metalized layer especially formed by laminating titanium-platinum-gold one after another is very suitable because of its high bonding strength to the light transmitting member and high wettability to the brazing material, and the metalized layer can be brazed strongly to the fixing member.

In the invention it is preferable that the fixing member is welded to an outer periphery around the through hole of the frame by a local heating method.

Since the fixing member is attached to the frame by welding by the local heating method and the heating range is narrow, thermal stress which occurs between the fixing member and the frame is very small even if the coefficients of thermal expansion of the two are different. As a result, an adverse effect of the thermal stress caused by the difference in coefficient of thermal expansion on the light transmitting member hardly occurs and the light excited by the photosemiconductor element which transmits through the light transmitting member can be prevented from being double-refracted in the light transmitting member and efficiently received by the optical fiber member, with the result that the transmission efficiency of optical signal is enhanced.

In the invention it is preferable that the local heating method is implemented by irradiating a laser beam.

Because the local heating by means of the irradiation of laser beam is implemented by YAG and carbon dioxide gas with power of a very high energy density of $10^4$ to $10^7$ W per 1 $cm^2$ and the range to be heated is narrow, thermal stress generated between the fixing member and the frame is not so large and accordingly the light transmitting member is not adversely affected even when their coefficients of thermal expansion differ more or less.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
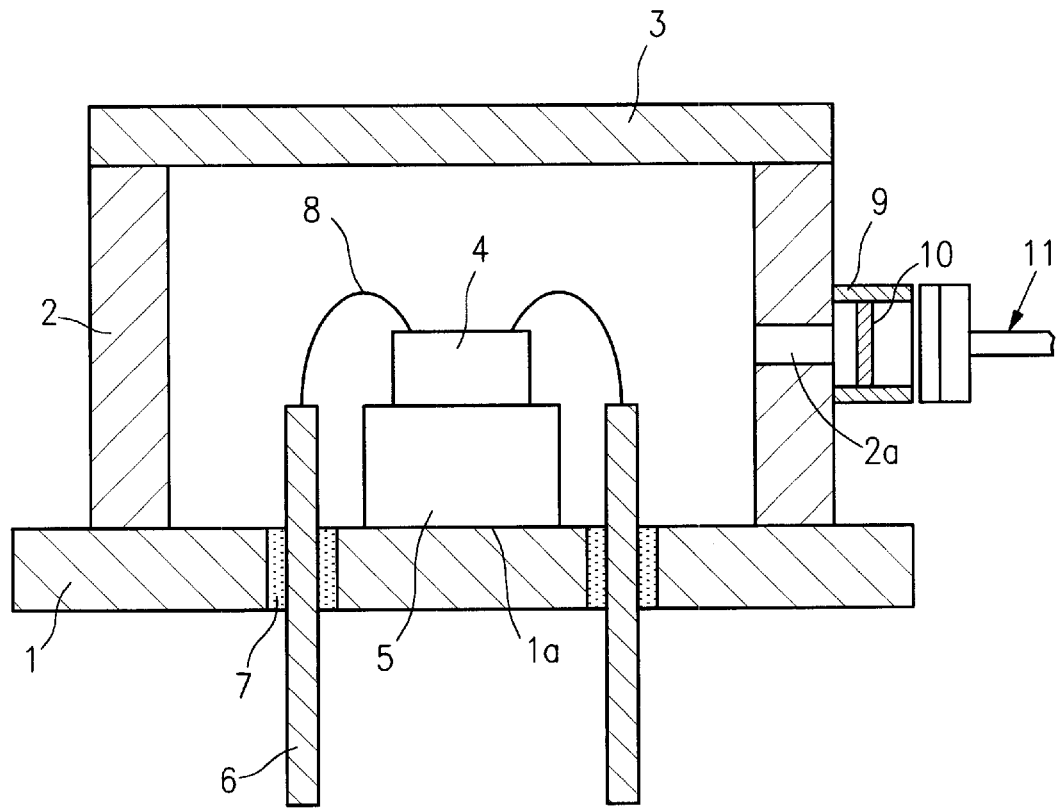
FIG. 1 is a section view showing one embodiment of a package for housing a photosemiconductor element according to the invention.

Now referring to the drawings, preferred embodiments of the invention are described below.

FIG. 1 shows one embodiment of a package for housing a photosemiconductor element of the invention, wherein a substrate 1, a frame 2 and a lid 3 compose a housing for housing a photosemiconductor element 4.

The substrate 1 functions as a supporting member for supporting the photosemiconductor element 4. The substrate 1 is provided with a mounting portion 1a for mounting the photosemiconductor element 4 almost at the center of a top surface thereof, to which mounting portion 1a the photosemiconductor element 4 is bonded and fixed by an adhesive such as a gold-silicon brazing material with a Peltier element 5 or the like being interposed therebetween.

The substrate 1 is composed of a metallic material such as an iron-nickel-cobalt alloy or a copper-tungsten alloy, and when made of the iron-nickel-cobalt alloy, is formed by, for example, shaping an ingot of the iron-nickel-cobalt alloy into a plate of a predetermined configuration by a well-known metalworking technique of the prior art, such as rolling or stamping.

It is noted that it is possible to effectively prevent the substrate 1 from being oxidized and corroded and to rigidly bond and fix the Peltier element 5 and the like disposed under the photosemiconductor element 4 onto the top surface of the substrate 1 by coating the outer surface of the substrate 1 with metals having an excellent corrosion resistance and good wettability to the brazing material, more specifically with a 2 to 6 $\mu$m thick nickel layer and a 0.5 to 5 $\mu$m thick gold layer in this order by means of the plating method. Accordingly, in order to effectively prevent the corrosion by oxidization and to bond and fix the Peltier element 5 or the like disposed under the photosemiconductor element 4 rigidly onto the top surface of the substrate 1, it is preferable to coat the outer surface of the substrate 1 with the 2 to 6 $\mu$m thick nickel layer and the 0.5 to 5 $\mu$m thick gold layer in this order by means of the plating method.

Further, a plurality of external lead terminals 6 which penetrate through the substrate 1 are fixed to the substrate 1 around the mounting portion 1a where the photosemiconductor element 4 is mounted via insulating members 7 such as glass.

The external lead terminal 6 electrically connects each electrode of the photosemiconductor element 4 to an external electrical circuit. One end of the external lead terminal 6 is connected with the electrode of the photosemiconductor element 4 via a bonding wire 8 and the other end is connected to the external electrical circuit by a brazing material, such as solder.

The external lead terminal 6 is made of a metallic material such as an iron-nickel-cobalt alloy and an ironnickel alloy for example. The external lead terminal 6 is fixed to the substrate 1 in the following manner: creating a hole having a diameter slightly larger than that of the external lead terminal 6 in the substrate 1, inserting the ring-shaped insulating member 7 made of glass and the external lead terminal 6 through the hole, and thereafter heating the insulating member 7 made of glass to melt the same.

It is noted that it is possible to effectively prevent the external lead terminal 6 from being oxidized and corroded and to connect the external lead terminal 6 with the bonding wire 8 rigidly by coating the outer surface of external lead terminal 6 with a plated metal layer such as a nickel plated layer and a gold plated layer having excellent corrosion resistance and good wettability to the brazing material in a thickness of 1.0 $\mu$m to 20 $\mu$m. Accordingly, it is preferable to coat the surface of the external lead terminal 6 with the plated metallic layer such as the nickel plated layer and the gold plated layer into the thickness of 1.0 $\mu$m to 20 $\mu$m.

On the top surface of the substrate 1, the frame 2 is bonded so as to surround the mounting portion 1a on which the photosemiconductor element 4 is mounted, to form a space for housing the photosemiconductor element 4 therein.

The frame 2 is made of a metallic material such as an iron-nickel-cobalt alloy and an iron-nickel alloy. The frame 2 is formed into the shape of a frame by pressing an ingot of metal such as an iron-nickel-cobalt alloy and is attached to the substrate 1 by brazing the top surface of the substrate 1 with the lower surface of the frame 2 via a silver brazing material.

The frame 2 is provided with a through hole 2a at a side thereof, a cylindrical fixing member 9 is attached onto an outer surface of the frame 2 around the through hole 2a and a light transmitting member 10 is attached inside the fixing member 9.

The through hole 2a which is created in the side of the frame 2 functions as a transmission hole for transmitting the light excited by the housed photosemiconductor element 4 to an optical fiber member 11 connected to the fixing member 9 described later. The through hole 2a is formed into a predetermined shape by drilling the side of the frame 2 by the conventional known method.

The cylindrical fixing member 9 is attached to the outer surface of the side of the frame 2 around the through hole 2a. The fixing member 9 functions as an underlying fixing member in fixing the optical fiber member 11 to the frame 2 and transmits the light excited by the photosemiconductor element 4 which transmits through the through hole 2a of the frame 2 to the optical fiber member 11. One end of the fixing member 9 is attached to the outer surface of the frame 2 around the through hole 2a via a brazing material such as a gold-tin alloy and the optical fiber member 11 is connected with the fixing member 9 by attaching the optical fiber member 11 to the other end thereof.

The cylindrical fixing member 9 is made of an alloy of from 40 to 60 wt % iron and from 40 to 60 wt % nickel and is formed into the cylindrical shape by pressing an ingot or the like of the iron-nickel alloy.

Inside the fixing member 9 is attached the light transmitting member 10, which closes the inside of the fixing a member 9, holds the hermetic sealing of the housing composed of the substrate 1, the frame 2 and the lid 3 and transmits the light excited by the photosemiconductor element 4 which transmits through the internal space of the fixing member 9, to the optical fiber member 11 attached and connected with the fixing member 9 as it is.

The light transmitting member 10 is made of lead type amorphous glass which mainly contains a silicon oxide and a lead oxide or boro-silicate type amorphous glass which mainly contains a boric acid and siliceous sand. Because the amorphous glasses of these types have no crystallographic axis, when the light excited by the photosemiconductor element 4 is transmitted through the transmitting member 10 to be received by the optical fiber member 11, the light excited by the photosemiconductor element 4 is received by the optical fiber member 11 as it is without being double refracted in the transmitting member 10, with the result that the optical fiber member 11 efficiently receives the light excited by the photosemiconductor element 4 and high efficiency of transmission of optical signal is achieved.

Figure 2:
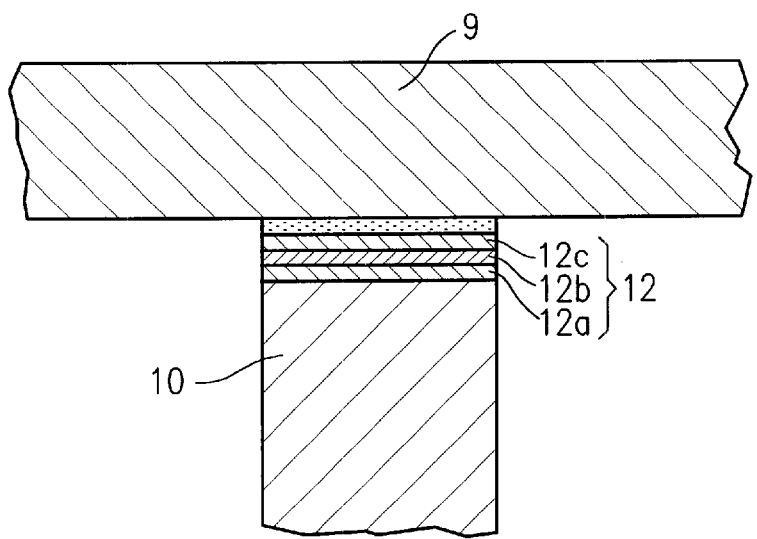
FIG. 2 is an enlarged section view of the main part of the package for housing a photosemiconductor element shown in FIG. 1.

FIG. 2 is an enlarged section view of the main part showing the state in which the light transmitting member 10 is attached to the fixing member 9. In the present embodiment, attaching of the transmitting member 10 to the fixing member 9 is carried out by brazing the fixing member 9 to a metalized layer 12 via a brazing material such as a gold-tin alloy, the metalized layer 12 being adhered to the outer surface of the transmitting member 10 in advance. Because the light transmitting member 10 is attached to the fixing member 9 by brazing the gold-tin alloy in this case, the reliability of the attachment is enhanced. Thereby, the hermetic seal of the housing for housing the photosemiconductor element 4 at the part where the light transmitting member 10 is attached to the fixing member 9 is perfected and the photosemiconductor element 4 housed within the housing may be operated normally and stably for a long period of time. In the same time, the coefficient of thermal expansion of the fixing member 9 made of the alloy of from 40 to 60 wt % iron and from 40 to 60 wt % nickel is about 9.5×10$^{-6}$/°C. (room temperature to 400° C.) which is close to that of the thermal expansion of the light transmitting member 10 made of amorphous glass, so that no thermal stress due to difference in coefficient of thermal expansion occurs between the light transmitting member 10 and the fixing member 9 in brazing the light transmitting member 10 to the fixing member 9 and accordingly there exists no thermal stress in the light transmitting member 10. As a result, in transmitting the light excited by the photosemiconductor element 4, to the optical fiber member 11 via the light transmitting member 10, the excited light is received by the optical fiber member 11 as it is without being double-refracted in the light transmitting member 10 and the transmission efficiency of optical signal is very high.

It is noted that the metalized layer 12 adhered on the outer periphery of the light transmitting member 10 in advance cannot be formed by adopting the well known Mo—Mn method because the melting point of the amorphous glass composing the light transmitting member 10 is as low as about 700° C. Therefore, the metalized layer 12 is formed by laminating a first layer 12a made of at least one of titanium, titanium-tungsten and tantalum nitride which are active to the amorphous glass and which bond strongly therewith, a second layer 12b made of at least one of platinum, nickel and nickel-chrome which effectively prevent the first layer 12a from diffusing into a third layer 12c described later by heat in brazing the light transmitting member 10 to the fixing member 9 and the bonding strength of the metalized layer 12 to the light transmitting member 10 from deteriorating and the third layer 12c made of at least one of gold, platinum and copper which enhance the wettability of the brazing material to the metalized layer 12 and attach the light transmitting member 10 strongly to the fixing member 9 by strongly bonding the brazing material to the metalized layer 12 as shown in FIG. 2. The metalized layer 12 formed by laminating titanium-platinum-gold one after another is very suitable as the metalized layer 12 because bonding strength of the metalized layer 12 with the light transmitting member 10 is high, the wettability to the brazing material is good, and the light transmitting member 10 can be brazed to the fixing member 9.

The metalized layer 12 having the three-layer structure of the first layer 12a made of at least one of titanium, titanium-tungsten and tantalum nitride, the second layer 12b made of at least one of platinum, nickel and nickel-chrome and the third layer 12c made of at least one of gold, platinum and copper is formed by coating outer periphery of the light transmitting member 10 with the respective metallic materials and nitride one after another in a predetermined thickness on by means of the sputtering method, the evaporation method, the ion-plating method, the plating method or the like.

When the metalized layer 12 is formed by the first layer 12a made of at least one of titanium, titanium-tungsten and tantalum nitride, the second layer 12b made of at least one of platinum, nickel and nickel-chrome and the third layer 12c made of at least one of gold, platinum and copper, the bonding strength of the metalized layer 12 with respect to the light transmitting member 10 is tend to decrease when the thickness of the first layer 12a is below 500 angstroms and large stress becomes immanent within the first layer 12a and the first layer 12a is liable to be peeled off from the light transmitting member 10 due to the immanent stress in coating the first layer 12a to the light transmitting member 10 when the thickness of the first layer 12a exceeds 2000 angstroms. Therefore, the thickness of the first layer 12a is preferable to be within the range from 500 to 2000 angstroms. When the thickness of the second layer 12b is below 500 angstroms, it is unable to effectively prevent the first layer 12a from diffusing to the third layer 12c by heat in brazing the light transmitting member 10 to the fixing member 9 and there is a danger that the bonding strength of the metalized layer 12 with respect to the light transmitting member 10 drops. When the thickness of the second layer 12b exceeds 10000 angstroms, large stress becomes immanent within the second layer 12b in coating the second layer 12b on the first layer 12a and the second layer 12b is liable to be peeled off from the first layer 12a due to the immanent stress. Therefore, the thickness of the second layer 12b is preferable to be within the range from 500 to 10000 angstroms. When the thickness of the third layer 12c is below 0.5 $\mu$m, the wettability of the brazing material to the metalized layer 12 is not enhanced so much and it is liable to become difficult to braze the light transmitting member 10 rigidly to the fixing member 9. When the thickness of the third layer 12c exceeds 5 $\mu$m, large stress becomes immanent within the third layer 12c in coating the second layer 12b with the third layer 12c and the third layer 12c is liable to be peeled off from the second layer 12b due to the immanent stress. Therefore, the thickness of the third layer 12c is preferable to be in the range of 0.5 $\mu$m to 5 $\mu$m.

The fixing member 9 to which the light transmitting member 10 is attached is attached to the frame 2 by means of welding by local heating by irradiating a laser beam or the like. For instance, the welding is carried out by disposing the cylindrical fixing member 9 to which the light transmitting member 10 is attached onto the outer surface around the through hole 2a of the frame 2 and melting and integrating part of the fixing member 9 with part of the frame 2 by irradiating a laser beam emitted in a ring by means of YAG and carbon dioxide gas and the like with power of very high energy density of $10^4$ to $10^7$ W per 1 cm$^2$. In this case, because the fixing member 9 is attached to the frame 2 by welding by a local heating method and the heating range is narrow, no large thermal stress occurs between the both nor will adversely affect the light transmitting member 10 to a large extent even if the coefficients of thermal expansion of the fixing member 9 and the frame 2 are different. As a result, it is possible to effectively prevent the light transmitting through the light transmitting member 10 from being double-refracted in the light transmitting member 10, to cause the optical fiber member 11 to efficiently receive the excited light of the photosemiconductor element 4 and to enhance the transmission efficiency of optical signal.

Meanwhile, the lid 3 made of a metallic material such as an iron-nickel-cobalt alloy and an iron-nickel alloy for example is bonded on the top surface of the frame 2. Thereby, the photosemiconductor element 4 is hermetically sealed within the housing composed of the substrate 1, the frame 2 and the lid 3.

The lid 3 is bonded to the top surface of the frame 2 by means of welding such as the seam-welding method.

Thus, according to the package for housing a photosemiconductor element of the invention, the photosemiconductor device which is a final product is fabricated in the following manner; mounting and fixing the photosemiconductor element 4 onto the mounting portion 1a of the substrate 1 with the Peltier element 5 or the like being interposed therebetween; electrically connecting each electrode of the photosemiconductor element 4 to the external lead terminal 6 via the bonding wire 8; bonding the lid 3 on the top surface of the frame 2; housing the photosemiconductor element 4 in the housing composed of the substrate 1, the frame 2 and the lid 3; and finally attaching and connecting the optical fiber member 11 to the fixing member 9 on the frame 2. The photosemiconductor device is used for high speed optical communication and the like by causing the photosemiconductor element 4 to excite light responding to a driving signal supplied from the external electric circuit, causing the optical fiber member 11 to receive the excited light via the light transmitting member 10 composed of the amorphous glass and transmitting the light within the optical fiber of the optical fiber member 11.

The invention may be embodied in other specific forms such as the form of fixing the external lead terminal 6 to the frame without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A package for housing a photosemiconductor element comprising:
   a substrate having a mounting portion on a top surface of which a photosemiconductor element is mounted;
   a frame attached onto the substrate so as to surround the mounting portion, having a through hole on a side thereof;
   a cylindrical fixing member attached onto an outer surface of the frame around the through hole of the frame, the cylindrical fixing member having a space therein in which an optical signal is transmitted;
   a light transmitting member attached to the cylindrical fixing member, for clogging an inside of the fixing member; and
   a lid attached to a top surface of the frame, for hermetically sealing the photosemiconductor element,
   wherein the fixing member is made of an alloy of from 40 to 60 wt % iron and from 40 to 60 wt % nickel and wherein the difference between a coefficient of thermal expansion of the light transmitting member and the coefficient of thermal expansion of the fixing member is less than $4\times10^{-6}/°C$.

2. The package for housing a photosemiconductor element of claim 1, wherein the light transmitting member is made of amorphous glass.

3. The package for housing a photosemiconductor element of claim 1, wherein the light transmitting member is brazed to the fixing member via a metalized layer comprising a first layer made of at least one of titanium, titanium-tungsten and tantalum nitride, a second layer made of at least one of platinum, nickel and nickel-chrome and a third layer made of at least one of gold, platinum and copper.

4. The package for housing a photosemiconductor element of claim 1, wherein the difference between a coefficient of thermal expansion of the light transmitting member and the coefficient of thermal expansion of the fixing member is less than $1\times10^{-6}/°C$.

5. A package for housing a photosemiconductor element comprising:
   a substrate having a mounting portion on a top surface of which a photosemiconductor element is mounted;
   a frame attached onto the substrate so as to surround the mounting portion, having a through hole on a side thereof;
   a cylindrical fixing member attached onto an outer surface of the frame around the through hole of the frame, the cylindrical fixing member having a space therein in which an optical signal is transmitted;
   a light transmitting member attached to the cylindrical fixing member, for clogging an inside of the fixing member; and
   a lid attached to a top surface of the frame, for hermetically sealing the photosemiconductor element,
   wherein the fixing member is made of an alloy of from 40 to 60 wt % iron and from 40 to 60 wt % nickel and wherein the difference between a coefficient of thermal expansion of the light transmitting member and the coefficient of thermal expansion of the fixing member is less than $4\times10^{-6}/°C$.; and
   wherein the fixing member is welded to an outer periphery around the through hole of the frame by a local heating method.

6. The package for housing a photosemiconductor element of claim 5, wherein the local heating method is implemented by irradiating a laser beam.

7. The package for housing a photosemiconductor element of claim 5, wherein the difference between a coefficient of thermal expansion of the light transmitting member and the coefficient of thermal expansion of the fixing member is less than $1\times10^{-6}/°C$.

8. A package for housing a photosemiconductor element comprising:
   a substrate having a mounting portion on a top surface of which a photosemiconductor element is mounted;
   a frame attached onto the substrate so as to surround the mounting portion, having a through hole on a side thereof;
   a cylindrical fixing member attached onto an outer surface of the frame around the through hole of the frame, the cylindrical fixing member having a space therein in which an optical signal is transmitted;
   a light transmitting member attached to the cylindrical fixing member, for clogging an inside of the fixing member; and
   a lid attached to a top surface of the frame, for hermetically sealing the photosemiconductor element, and
   wherein the fixing member is made of an alloy of from 40 to 60 wt % iron and from 40 to 60 wt % nickel.

* * * * *